United States Patent
Murata et al.

(10) Patent No.: US 8,021,593 B2
(45) Date of Patent: Sep. 20, 2011

(54) METHOD OF PRODUCING A THREE-DIMENSIONAL STRUCTURE AND FINE THREE-DIMENSIONAL STRUCTURE

(75) Inventors: Kazuhiro Murata, Tsukuba (JP); Hiroshi Yokoyama, Tsukuba (JP)

(73) Assignees: Sijtechnology, Inc., Ibaraki (JP); National Institute of Advanced Industrial Science and Technology, Tokyo (JP)

( * ) Notice: Subject to any disclaimer, the term of this patent is extended or adjusted under 35 U.S.C. 154(b) by 1074 days.

(21) Appl. No.: 10/566,476

(22) PCT Filed: Jul. 29, 2004

(86) PCT No.: PCT/JP2004/011199
§ 371 (c)(1),
(2), (4) Date: Jan. 31, 2006

(87) PCT Pub. No.: WO2005/012161
PCT Pub. Date: Feb. 10, 2005

(65) Prior Publication Data
US 2006/0198959 A1 Sep. 7, 2006

(30) Foreign Application Priority Data
Jul. 31, 2003 (JP) .................... 2003-284062

(51) Int. Cl.
*B05D 3/00* (2006.01)
*B29C 35/00* (2006.01)
*B05D 5/00* (2006.01)

(52) U.S. Cl. ............. 264/401; 425/375; 425/174.2; 264/113; 264/308

(58) Field of Classification Search .......... 264/401, 264/113, 308; 425/375, 174.2; 347/1
See application file for complete search history.

(56) References Cited

U.S. PATENT DOCUMENTS

| 3,916,421 A | * | 10/1975 | Hertz ................. 347/73 |
| 4,897,667 A | * | 1/1990 | Uchiyama et al. ........ 347/10 |
| 4,929,400 A | | 5/1990 | Rembaum et al. |
| 5,121,329 A | * | 6/1992 | Crump ................ 700/119 |
| 5,266,098 A | | 11/1993 | Chun et al. |
| 5,736,074 A | | 4/1998 | Hayes et al. |

(Continued)

FOREIGN PATENT DOCUMENTS
JP 61-59911 B2 12/1986

(Continued)

OTHER PUBLICATIONS

Donald J. Hayes et al., Journal of Electronics Manufacturing, vol. 8, Nos. 3 & 4, 1998, pp. 209-216.

(Continued)

*Primary Examiner* — Joseph S Del Sole
*Assistant Examiner* — Nahida Sultana
(74) *Attorney, Agent, or Firm* — Birch, Stewart, Kolasch & Birch, LLP

(57) ABSTRACT

A method of producing a three-dimensional structure contains the steps of: arranging a substrate close to a tip of a needle-shaped fluid-ejection body having a fine diameter supplied with a solution, ejecting a fluid droplet having an ultra-fine diameter toward a surface of the substrate by applying a voltage having a prescribed waveform to the needle-shaped fluid-ejection body, making the droplet fly and land on the substrate, and solidifying the droplet after the fluid droplet is landed on the substrate; further a three-dimensional structure has a fine diameter comprises droplets having an ultra-fine particle diameter, wherein the structure is grown by solidifying the droplets and stacking the solidified droplets.

25 Claims, 10 Drawing Sheets

U.S. PATENT DOCUMENTS

| | | | | |
|---|---|---|---|---|
| 5,807,437 | A | * | 9/1998 | Sachs et al. ............... 118/688 |
| 5,997,795 | A | * | 12/1999 | Danforth et al. ............ 264/401 |
| 6,114,187 | A | * | 9/2000 | Hayes ......................... 438/106 |
| 6,357,855 | B1 | | 3/2002 | Kerekes et al. |
| 7,141,617 | B2 | * | 11/2006 | Gratson et al. ............. 523/160 |
| 7,434,912 | B2 | * | 10/2008 | Murata ......................... 347/44 |
| 2002/0054912 | A1 | * | 5/2002 | Kim et al. ................... 424/489 |
| 2002/0111707 | A1 | | 8/2002 | Li et al. |
| 2004/0251581 | A1 | * | 12/2004 | Jang et al. .................. 264/497 |
| 2005/0012247 | A1 | * | 1/2005 | Kramer et al. .............. 264/401 |
| 2005/0042320 | A1 | * | 2/2005 | Hasei .......................... 425/375 |
| 2005/0160964 | A1 | * | 7/2005 | Champion et al. ............. 117/2 |
| 2005/0275129 | A1 | * | 12/2005 | Sambu et al. ............... 264/113 |
| 2006/0262163 | A1 | * | 11/2006 | Nishio et al. .................. 347/55 |
| 2007/0029693 | A1 | * | 2/2007 | Wigand et al. .............. 264/113 |
| 2007/0029698 | A1 | * | 2/2007 | Rynerson et al. ........... 264/219 |
| 2008/0245266 | A1 | * | 10/2008 | Lewis et al. ............. 106/31.13 |
| 2010/0096596 | A1 | * | 4/2010 | Lewis et al. ................ 252/500 |
| 2010/0330220 | A1 | * | 12/2010 | Gratson et al. ............. 425/150 |

FOREIGN PATENT DOCUMENTS

| | | |
|---|---|---|
| JP | 8-71489 A | 3/1996 |
| JP | 2000-516529 A | 12/2000 |
| JP | 2001-38911 A | 2/2001 |
| JP | 2001-088306 A | 4/2001 |
| JP | 2002-120230 A | 4/2002 |
| JP | 2002-538461 A | 11/2002 |
| JP | 2003-183012 A | 7/2003 |
| JP | 2004-83999 A | 3/2004 |
| JP | 2004-114375 A | 4/2004 |
| JP | 2004-165587 A | 6/2004 |
| WO | WO-00/52455 A1 | 9/2000 |
| WO | WO-02/00354 A1 | 1/2002 |
| WO | WO-03/070381 A1 | 8/2003 |

OTHER PUBLICATIONS

Kazuhiro Murata, "Super-fine ink-jet printing for nanotechnology," Proceedings of the International Conference on MEMS, NANO and Smart Systems, pp. 346-349, IEEE Computer Society, Jul. 23, 2003.

European Search Report issued in application No. EP 04 074 8246, Jul. 1, 2011.

Fuller et al., "Ink-Jet Printed Nanoparticle Microelectrochemical Systems," Journal of Microelectricalchemical Systems, vol. 11, No. 1, pp. 54-60, IEEE, Feb. 2002.

Snyder et al., "Deposition of Molten Eutectic Solder Using Jet Printing Techniques," Materials Research Society Symposium, vol. 390, pp. 201-211, Materials Research Society, 1995.

* cited by examiner

METHOD OF PRODUCING A THREE-DIMENSIONAL STRUCTURE AND FINE THREE-DIMENSIONAL STRUCTURE

TECHNICAL FIELD

The present invention relates to a method of producing a three-dimensional structure, by ejecting an ultra-fine fluid comprising particulates of metal, ceramics, semiconductor, polymer, precursor of ceramics or polymer, or the like to a substrate with applying a voltage to the vicinity of a fluid-ejecting body having an ultra-fine diameter, and by stacking them on the substrate. Further, the present invention relates to a fine three-dimensional structure formed by the method.

BACKGROUND ART

A relatively wide variety of materials can be used in an inkjet method, and the method dose not require manufacturing a photomask or a die in advance. A conventional inkjet recording method in which an ink drop is made to flow at an appropriate time has been known as a drop-on-demand method or the like, such as a piezoelectric conversion method, a bubble jet (registered trademark) method, or a thermal conversion methods of a thermal system or the like (for example, JP-B-61-5991). Various methods have been used in efforts to manufacture a three-dimensional structure using an inkjet or the like.

However, in the case of manufacturing a three-dimensional structure using an inkjet, there are some problems to be solved. One is that, because it is usually in a liquid state that is ejected by the inkjet, an ejected liquid itself can not be stacked up in three-dimensions. For this reason, in order to stack the ejected liquid, another means is required to solidify it.

A method is proposed of which a photo-setting resin is used as an ejection liquid, and the liquid drop is solidified after landing on a substrate. Further, a method of manufacturing a three-dimensional structure by ejecting a binder such as water onto a substrate made of powder such as plaster, to solidify the material of the substrate, has also been practiced. However, there is a limit to material to be used and the like in either of these two methods.

Moreover, a conventional inkjet recording method has the following fundamental problems to be solved to manufacture an ultra-fine three-dimensional structure.

<Difficulties in Ejection of an Ultra-Fine Droplet>

Currently, in an inkjet system (piezo system or thermal system) that is practically and popularly used, a minute amount of liquid such as smaller than 1 pl can hardly be ejected. This is because the pressure required for ejection increases as the diameter of the nozzle decreases to be finer.

<Luck of Landing Accuracy>

Kinetic energy given to a droplet ejected from a nozzle decreases in proportion to the cube of the droplet radius. For this reason, a fine droplet cannot possess kinetic energy that is sufficient to withstand air resistance, and accurate landing cannot be expected, because of air convection or the like. In addition, as the droplet becomes fine, the effect of surface tension increases, which makes the vapor pressure of the droplet become high, and drastically increases the amount of evaporation (In this invention, unless otherwise particularly specified, "evaporation" includes meaning of volatilization). With this being the case, the mass of the flying fine droplet is considerably lost and even the shape of the droplet can hardly be kept in landing.

As described above, miniaturization of a droplet and increased accuracy of landing positions thereof are incompatible subjects so that both cannot be easily realized at once.

In addition, in a special method using an inkjet method, a low-melting point solder alloy (lead-tin alloy) is ejected by a piezoelectric-type inkjet, to form a three-dimensional structure having a height of approximately 60 µm. In this method, the kinetic energy of a flying droplet is increased, to some extent, by using a solder alloy having a large specific gravity as ink. However, the diameter of the droplet is approximately from several tens of µm to 100 µm (for example, Electronics Manufacturing, MicroFab Technologies, Inc., D. J. Hayes, W. R. Cox and M. E. Grove, J. 8 (1998), 209).

Moreover, a method for forming a three-dimensional structure by an inkjet using solder utilizes the solidification of solder caused by a reduction in temperature when the solder is landed outo a substrate (for example, U.S. Pat. Nos. 5,736, 074 and 6,114,187). Therefore, in the above-mentioned method, the kinds of liquids to be ejected are limited by their melting points.

Furthermore, an electrostatic coating has been known as a method for forming a film by an electric field, and this method aims to obtain a uniform strong coating film, but the method cannot achieve formation of a three-dimensional structure.

As described above, it is difficult to manufacture an ultra-fine three-dimensional structure; for example, a pillar-shaped fine structure, by a conventional inkjet method.

A fine three-dimensional structure; above all, a structure having a high aspect ratio (length ratio in the direction of height relative to the short diameter in cross section or the bottom surface of a structure (height/diameter in cross section)), is applicable to many uses, including nano technology, for example, through holes and bumps in a surface-mounted substrate and the like. For example, a method for manufacturing a laminated integrated circuit unit, by utilizing a pillar-shaped three-dimensional structure having a cross-sectional diameter of 25 µm as a bump, is disclosed in U.S. Pat. No. 6,114,187. However, if a three-dimensional structure can be formed with high accuracy and can be further reduced in size, an integrated circuit having smaller size and higher integration density can also be manufactured.

Meanwhile, an electrohydrodynamic inkjet having a fine nozzle has been developed to realize the ejection of a minute amount of liquid (for example, JP-T-2002-538461 and JP-A-2001-38911). However, both of these technologies aim to take out a minute amount of liquid in a liquid state or a sprayed state, and hence they cannot be applied to the formation of a three-dimensional structure. Moreover, the diameter of a nozzle disclosed in the patent documents is several tens of µm and cannot be satisfactory in terms of forming a finer three-dimensional structure.

As described above, inkjet and methods for forming a three-dimensional structure by utilizing the same have been proposed, but they cannot be said to be sufficient in terms of the accuracy with which a liquid drop is landed on a substrate, the fine fabrication of a three-dimensional structure, and materials to be used. Therefore, a method for solving these problems has been required.

Other and further features and advantages of the invention will appear more fully from the following description, taken in connection with the accompanying drawings.

DISCLOSURE OF INVENTION

Figures 1A, 1B, 1C:
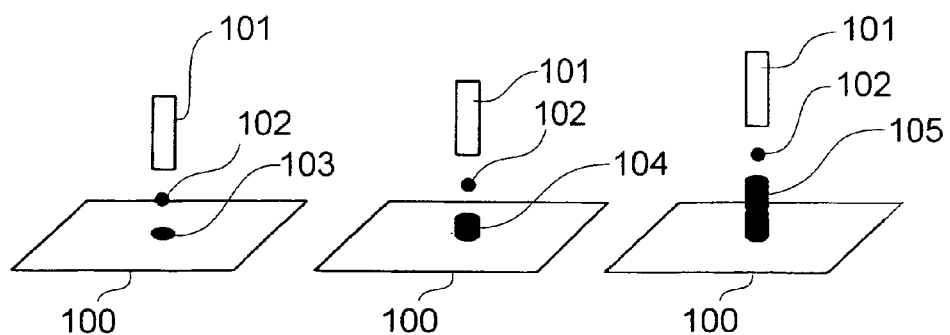
FIG. 1(a) is a schematic drawing showing the initial stage of a process for manufacturing a fine three-dimensional structure according to the production method of the present invention.
FIG. 1(b) and FIG. 1(c) are schematic drawings showing the middle stage and the final stage of the process, respectively.

According to the present invention, there are provided the following means:

(1) A method of producing a three-dimensional structure, comprising the steps of arranging a substrate close to a tip of a needle-shaped fluid-ejection body having a fine diameter and supplied with a solution; ejecting a fluid droplet having an ultra-fine diameter toward a surface of the substrate by applying a voltage having a prescribed waveform to the needle-shaped fluid-ejection body, making the droplet fly and land on the substrate, and solidifying the droplet after the fluid droplet is landed on the substrate.

(2) The method of producing a three-dimensional structure according to (1), wherein an electric field is focused at a solidified substance formed of previously landed droplet, and a subsequent droplet is stacked on said solidified substance.

(3) The method of producing a three-dimensional structure according to (1) or (2), wherein an electric field is focused at the top of a three-dimensional substance formed of the solidified substance of the droplet, and wherein the three-dimensional substance is grown by stacking the subsequent flying droplet on the top of the three-dimensional substance.

(4) The method of producing a three-dimensional structure according to any one of (1) to (3), wherein a cross-sectional diameter of the three-dimensional structure is controlled by a volatile property of the droplet ejected from the needle-shaped fluid-ejection body.

(5) The method of producing a three-dimensional structure according to any one of (1) to (4), wherein a temperature of the substrate is controlled in that the previously landed droplet on the substrate is volatilized to be hard enough for the subsequent droplet stacked thereon.

(6) The method of producing a three-dimensional structure according to any one of (1) to (5), wherein a surface temperature of the substrate is controlled by at least one heating means selected from the group consisting of a Peltier element, an electric heater, an infrared heater, a heater using fluid such as an oil heater, a silicon rubber heater, and a thermistor, that is fixed to the substrate or a substrate supporting body.

(7) The method of producing a three-dimensional structure according to any one of (1) to (6), wherein a surface temperature of the substrate is controlled in a range of from room temperature to 100° C.

(8) The method of producing a three-dimensional structure according to any one of (1) to (7), wherein the fluid is a solution containing metal particulates.

(9) The method of producing a three-dimensional structure according to any one of (1) to (7), wherein the fluid is a polymer solution.

(10) The method of producing a three-dimensional structure according to any one of (1) to (7), wherein the fluid is a solution containing ultra-fine ceramic particles.

(11) The method of producing a three-dimensional structure according to any one of (1) to (7), wherein the fluid is a sol-gel solution of ceramics.

(12) The method of producing a three-dimensional structure according to any one of (1) to (7), wherein the fluid is a low molecular weight compound solution.

(13) The method of producing a three-dimensional structure according to any one of (1) to (7), wherein the fluid is a fluid containing at least one solution selected from the group consisting of a solution containing metal particulates, a polymer solution, a solution containing ultra-fine ceramic particles, a sol-gel solution of ceramics, and a low-molecular, weight compound solution.

(14) The method of producing a three-dimensional structure according to any one of (1) to (13), wherein a diameter of the ejected droplet is 15 μm or less.

(15) The method of producing a three-dimensional structure according to (14), wherein a diameter of the droplet is 5 μm or less.

(16) The method of producing a three-dimensional structure according to (14), wherein a diameter of the droplet is 3 μm or less.

(17) The method of producing a three-dimensional structure according to any one of (1) to (16), wherein a time required for the droplet to be dried and solidified is 2 seconds or less.

(18) The method of producing a three-dimensional structure according to (17), wherein the time required for the droplet to be dried and solidified is 1 second or less.

(19) The method of producing a three-dimensional structure according to (17), wherein the time required for the droplet to be dried and solidified is 0.1 second or less.

(20) The method of producing a three-dimensional structure according to any one of (1) to (19), wherein a flying speed of the droplet is 4 m/sec or more.
(21) The method of producing a three-dimensional structure according to (20), wherein the flying speed is 6 m/sec or more.
(22) The method of producing a three-dimensional structure according to (20), wherein the flying speed is 10 m/sec or more.
(23) The method of producing a three-dimensional structure according to any one of (1) to (22), wherein the steps are conducted in an atmosphere having a vapor pressure of the fluid lower than a saturated vapor pressure of the fluid.
(24) The method of producing a three-dimensional structure according to any one of (1) to (23), wherein a dielectric constant of the fluid to be ejected is 1 or more.
(25) A three-dimensional structure having a fine diameter comprises droplets having an ultra-fine particle diameter, wherein the structure is grown by solidifying the droplets and stacking the solidified droplets.
(26) The three-dimensional structure according to (25), wherein an aspect ratio of the structure is 2 or more.
(27) The three-dimensional structure according to (26), wherein the aspect ratio of the structure is 3 or more.
(28) The three-dimensional structure according to (26), wherein the aspect ratio of the structure is 5 or more.
(29) The three-dimensional structure according to any one of (25) to (28), wherein a particle diameter of the droplet is 15 μm or less.
(30) The three-dimensional structure according to (29), wherein the particle diameter of the droplet is 5 μm or less.
(31) The three-dimensional structure according to (29), wherein the particle diameter of the droplet is 3 μm or less.

BEST MODE FOR CARRYING OUT THE INVENTION

Hereinafter, the present invention will be further described.

In the method of producing a three-dimensional structure of the present invention, a fine fluid is flown to a substrate using an electric field, and it is quickly solidified using rapid drying property of a fine droplet to thereby produce the three-dimensional structure. In the method of producing the three-dimensional structure according to the present invention, as an fine droplet, the droplet diameter is, but it is not limited, preferably 15 μm or less, more preferably 5 μm or less, still more preferably 3 μm or less, and particularly preferably 1 μm or less. A cross-sectional diameter (shorter side diameter of cross-section or a bottom surface) of a fine three-dimensional structure formed by this ultra-fine droplet is preferably 15 μm or less, more preferably 5 μm or less, still more preferably 3 μm or less, and particularly preferably 1 μm or less. Then, the three-dimensional structure according to the present invention is such that grows not two-dimensionally but three-dimensionally in the direction of height, and the three-dimensional structure is formed preferably in the shape in which height is equal to or more than the cross-sectional diameter of its base portion such as a pillar. In other words, the three-dimensional structure has an aspect ratio of 1 or more, more preferably has an aspect ratio of 2 or more, still more preferably has an aspect ratio of 3 or more, and particularly preferably has an aspect ratio of 5 or more. There is not an upper limit to the height or the aspect ratio of the three-dimensional structure, and the three-dimensional structure can be grown to be of an aspect ratio of 100 or more, or 200 or more, if the three-dimensional structure can stand by itself even if it is slightly bent. As for the shape of the three-dimensional structure, the three-dimensional structure can be formed in the shape of a circular pillar, an elliptical pillar, or even if the three-dimensional structure having a projected shape from upper side is like line, the three-dimensional structure has a preferable thickness as compared with the width of the line is included.

In the method of producing a three-dimensional structure according to the present invention, ultra-fine droplets are discharged using ultra-fine inkjet. The ultra-fine droplets are evaporated extremely quickly by the influence of surface tension and the magnitude of a specific surface area. Hence, by controlling the drying and solidifying of the droplet (in the present invention, unless otherwise specified, the terms of drying and solidifying means that the liquid drops are evaporated and dried, thereby being increased in viscosity at least to a level such that the droplets can be stacked up), impact energy, focusing of electric filed, and the like at appropriate levels, it is possible to form a three-dimensional structure having height. Hereinafter, these points will be described in more detail.

(Accurate Landing of Droplet with Focusing Electric Field)

In the method of producing a three-dimensional structure according to the present invention, stress toward the tip of a needle-shaped fluid discharging body (hereinafter also referred to as "nozzle") is continuously applied to the top of a structure formed by droplets that have been previously landed to a substrate (hereinafter also referred to as "previously landed droplets") and that have been solidified, in virtue of an effect of an electric field applied to an ultra-fine inkjet. Accordingly, once a structure starts growing, an electric field to be described later in FIG. 5 can be focused on the top of the structure. For this reason, an ejected droplet can be reliably and accurately landed on the top of the structure formed by the droplets having attached in advance.

Furthermore, the structure can be grown in the direction of the nozzle while it is always pulled by the above-mentioned effect produced by the electric field, and hence even if the structure has a high aspect ratio the structure can be formed without falling. These effects can efficiently promote the growth of a three-dimensional structure.

This process is schematically shown in FIGS. 1(a), 1(b), and 1(c). FIG. 1(a) shows the initial stage of forming a three-dimensional structure. An ultra-fine droplet 102 ejected toward a substrate 100 from a nozzle 101 lands on the substrate 100, and being brought into the state of a solidified liquid droplet (substance such that the liquid drop is solidified) 103. FIG. 1(b) shows a middle stage in which the droplets continuously land and solidify and stack to form a structure 104. FIG. 1(c) shows a final stage in which the ultra-fine droplets land centrally to the top of the structure having stacked on the substrate in the above-mentioned manner to form a three-dimensional structure 105.

It is preferable that material having a high dielectric constant or fluid material having a high conductivity is used as a material used for the method of producing a three-dimensional structure according to the present invention. For example, the dielectric constant is preferably 1 or more, more preferably 2 to 10, and conductivity is preferably $10^{-5}$ S/m or more. It is preferable that fluid material easily causing focus of an electric field is used for the method. It is preferable that a liquid material and a substance such that the liquid fluid material is solidified have a dielectric constant higher than the material of the substrate. An electric field is generated on the surface of the substrate by voltage applied to the nozzle. In this case, when a droplet lands and attaches on the substrate, the density of electric line of force passing through the liquid becomes higher than that in a portion of the substrate where the droplet does not attach. This state is referred to as a state where focusing of an electric field is developed. Then, once a structure starts to be generated, at the top of the structure, there occurs polarization due to the electric field or focusing of the electric line of force because of its shape. The droplet flies along the electric line of force and the droplet is attracted to a portion where the density of the electric line of force is the highest. That is, the droplet is attracted to the top of the pre-formed structure. For this reason, a subsequently flying droplet stacks selectively and accurately on the top of the structure.

The substrate may be an insulating material or a conductive material. A driving voltage, a driving voltage waveform, and a driving frequency may be changed in accordance with the growth of the structure.

The above-mentioned relationship between focusing of an electric field and the accurate attachment of a droplet to the top of the structure will be explained in more detail according to FIGS. 2($a$), 2($b$), and 2($c$) showing the relationship schematically.

<In the Case of a Nozzle Moved by a Large Amount: FIG. 2($a$)>

First, a three-dimensional structure 203 (three-dimensional structure formed by a nozzle 201) was formed by a nozzle at an initial position 201 (initial position nozzle). Then, the nozzle 201 was moved by a large amount in the direction parallel to a substrate, and a droplet 202$a$ (ultra-fine droplet ejected from the nozzle 201$a$) was ejected from the nozzle 201$a$ (nozzle moved by a large amount). Effect of the electric field was not applied between the initial three-dimensional structure 203 and the tip of the nozzle 201$a$. Therefore, the droplet 202$a$ was not affected by the three-dimensional structure 203, and a three-dimensional structure 203$a$ (three-dimensional structure formed by the nozzle 201$a$) was formed at a new landing position.

Figures 2A, 2B, 2C:
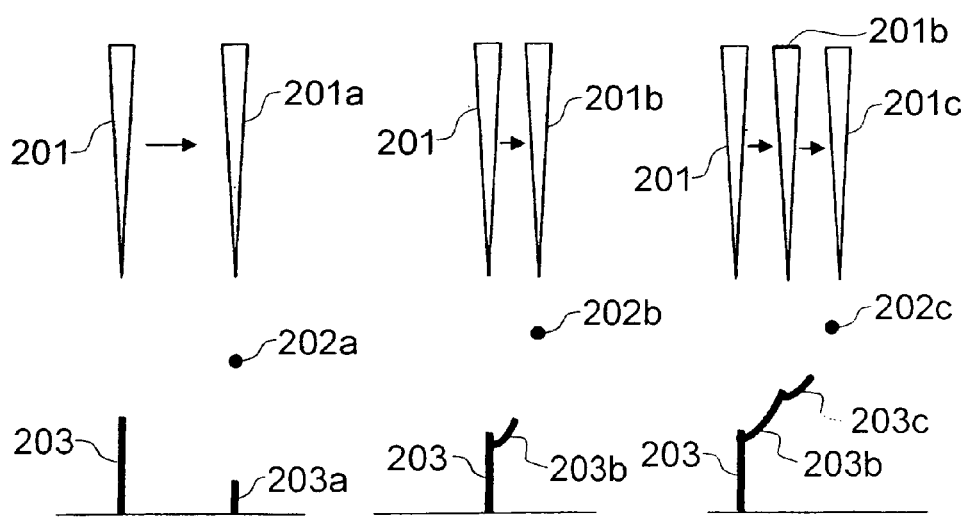
FIG. 2(a) is a schematic drawing showing influence of focusing of an electric field by the shape of a three-dimensional structure formed by moving a nozzle by a large amount in the production method of the present invention.
FIG. 2(b) is a schematic drawing showing influence of focusing of an electric field by the shape of a three-dimensional structure formed by moving a nozzle by a small amount in the production method of the present invention.
FIG. 2(c) is a schematic diagram showing influence of focusing of an electric field by the shape of a three-dimensional structure formed by further moving a nozzle by a small amount in the production method of the present invention.

<In the Case of a Nozzle Moved by a Small Amount: FIG. 2B>

Meanwhile, the nozzle 201$b$ (nozzle moved by a small amount) was moved by a small amount within a range where an electric field generated by the nozzle could effect. In this position, a droplet 202$b$ (ultra-fine droplet ejected from the nozzle 201$b$) was ejected from the nozzle 201$b$. This droplet 202$b$ files along the electric line of force, because the electric field was effected between the top of the initial three-dimensional structure 203 and the tip of the nozzle 201$b$. As a result, the liquid drop 202$b$ was attracted and landed onto the top of the three-dimensional structure 203. When the droplets were continuously ejected in this state, a three-dimensional structure 203$b$ having a branched shape (three-dimensional structure formed by the nozzle 201$b$) was grown toward the nozzle 201$b$ from near the top of the initial three-dimensional structure 203.

<In the Case of a Nozzle Further Moved by a Small Amount: FIG. 2($c$)>

After the three-dimensional structure 203$b$ having branched shape was grown, the nozzle 201$c$ (nozzle further moved by a small amount) was further moved by a small amount and a droplet 202$c$ (ultra-fine droplet ejected from the nozzle 201$c$) was ejected. In this position, because the electric field was effected between the three-dimensional structure 203$b$ and the tip of the nozzle 201$c$, the droplet 202$c$ was attracted and attached onto the top of the three-dimensional structure 203$b$. When the droplets 202$c$ were continuously ejected, a three-dimensional structure 203$c$ (three-dimensional structure formed by the nozzle 201$c$) having a further branched shape toward the nozzle 201$c$ from the top of the three-dimensional structure 203$b$ was grown.

Figure 3:
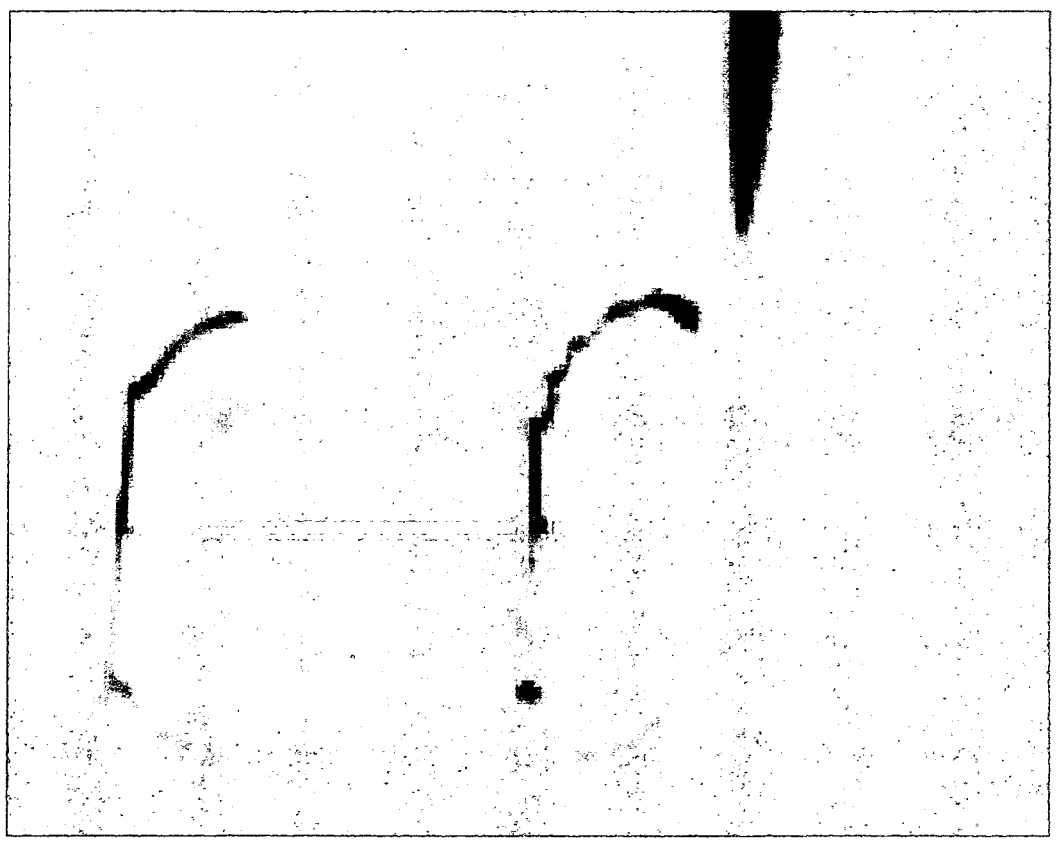
FIG. 3 is a photograph showing an example of the shape of a three-dimensional structure formed by moving a nozzle little by little.

An example of the three-dimensional structure that was actually formed when the nozzle was moved little by little is shown in FIG. 3.

The facts shown in FIGS. 2($a$), 2($b$), and to 2($c$) corroborate, in the method of producing a three-dimensional structure according to the present invention, that an electric field is generated between the tip of the nozzle and the top of the three-dimensional structure, and a droplet is attracted by the top, thereby the accurate landing of the droplet is realized. Therefore, even in the case that droplets are so fine that it is usually difficult to secure accurate landing of droplets, according to the production method of the present invention, it is possible to guide subsequently flying droplets and accurately stack them. A three-dimensional structure with high accuracy can hence be formed.

Moreover, an electric field is not applied between the liquid ejection nozzle and the substrate, but an electric field generated by electrodes provided separately may be used. Furthermore, a driving voltage, a driving voltage waveform, and a driving frequency may be changed in accordance with the growth of the structure. The three-dimensional structure having a fine diameter produced by the production method of a three-dimensional structure according to the present invention can be made to have an aspect ratio of 3 or more, further 5 or more, still further 10 or more depending on use.

(Liquid Material Forming Fine Droplet)

As for liquid material forming a fine droplet used for the method of producing a three-dimensional structure according to the present invention, any liquid material can be used if it can fly little by little from a needle-shaped fluid ejection body of an ultra-fine droplet jet device (hereinafter, simply also referred to an "inkjet device"), and if it can attach onto a substrate.

For example, a metal particulate paste, a polymer solution such as an ethanol solution of polyvinyl phenol (for example, Markalinker (product name)), a sol-gel solution of ceramics, or a low-molecular-weight compound solution such as oligothiophene can be used.

One of these solutions may be used and a plurality of these solutions can be used in combination.

Material having a considerably high drying speed and having its viscosity changed by a large amount by drying can be preferably used as a material forming a three-dimensional structure.

Time required for the droplet to be dried and solidified, the flying speed of the droplet, and the vapor pressure of solvent in the atmosphere can be set as appropriate according to the solution to be a material forming a three-dimensional structure.

As for preferable conditions, time required for the droplet to be dried and solidified is preferably 2 seconds or less, more preferably 1 second or less, and particularly preferably 0.1 second or less; flying speed is preferably 4 m/sec or more, more preferably 6 m/sec or more, and particularly preferably 10 m/sec or more. The flying speed is particularly 20 m/sec or less, although there is no upper limit. Atmosphere of pressure is preferably less than the saturated vapor pressure of solvent.

(Control of Evaporation of Fine Droplet)

In the method of producing a three-dimensional structure according to the present invention, fine droplets are ejected by the use of an ultra-fine inkjet. In the fine droplet, the evaporation speed of solvent becomes extremely large by the effect of surface tension and the magnitude of specific surface area. In particular, as the droplet becomes finer, the effect of surface tension becomes larger, and hence the vapor pressure of the droplet becomes higher and the droplet evaporates drastically. For this reason, there is a possibility that even when fine droplets are produced, they might disappear before they reach the substrate. However, according to the method of producing a three-dimensional structure of the present invention, the evaporation of the droplets can be controlled to an appropriate level by electrically charging the droplets, and therefore the method can realize accurate landing on an object even if a droplet is so fine that it is impossible in a conventional technology.

Moreover, since the method of producing the present invention utilizes the moderate evaporation of the droplet, the sizes of the discharged droplets can be reduced and a three-dimensional structure can be formed with a cross-sectional diameter smaller than the diameters of the droplets when they are ejected. In other words, according to the production method of the present invention, a fine three-dimensional structure can be also manufactured, which is thought to be difficult in the conventional art, and a cross-sectional diameter of the fine three-dimensional structure can be freely controlled. Therefore, it is possible to control a cross-sectional diameter as appropriate not only by adjusting the diameter of a nozzle or the concentration of a solid component in the ejection fluid but also by using the evaporation of the ejected droplets. This control can be also determined in consideration of working efficiency such as time required to form a three-dimensional structure in addition to a required cross-sectional diameter. Moreover, for example, the following method can be employed as another control method. That is, an applied voltage is increased to increase the amount of liquid for ejection, and thereby dissolve a stacked substance that has been previously dried, solidified, and stacked. Then the applied voltage is lowered to decrease the amount of liquid to thereby again promote stacking and growth of droplets in the direction of height. In this manner, by changing the applied voltage to repetitively increase or decrease the amount of liquid, it is possible to grow a three-dimensional structure while securing a required cross-sectional diameter.

As for the control range of a cross-sectional diameter, in the case of increasing a cross-sectional diameter, with taking the working efficiency into consideration, the cross-sectional diameter is preferably 20 times or less, more preferably 5 times or less the inside diameter of the tip of the nozzle. In the case of decreasing the cross-sectional diameter, the cross-sectional diameter is preferably 1/10 or more times, more preferably 1/5 or more times, and particularly preferably 1/2 or more times the inside diameter of the tip of the nozzle.

(Substrate Temperature)

In the process of stacking and building the solidified substance of droplets on the substrate in virtue of the evaporation of the ejected droplets in the manner described above, according to the method of producing a three-dimensional structure of the present invention, by controlling a temperature of a surface of the substrate, the volatile property of the liquid component of the droplet can be promoted when and after the droplet landing on the substrate, whereby the viscosity of the landing droplet can be increased within a desired period of time. Accordingly, for example, even under conditions where the droplet is usually hard to be stacked on because the amount of liquid of the droplet is too large, heating of the surface of the substrate makes it possible to accelerate the drying and solidifying of the droplet, and to stack and build the substance of the droplets, and hence formation of a three-dimensional structure can be realized. Moreover, the increasing of the speed of drying and solidifying the droplet can make the interval of ejecting droplets shorter and can improve working efficiency also.

A controlling means of the substrate temperature is not particularly limited, and a Peltier element, an electric heater, an infrared heater, a heater using fluid such as an oil heater, a silicon rubber heater, or a thermistor can be used. Moreover, the substrate temperature can be controlled as appropriate according to the volatile property of liquid of material or a droplet to be used, and it is preferably from room temperature to 100° C., more preferably from 30° C. to 80° C., and especially preferably from 40° C. to 70° C. The substrate temperature is preferably set at a temperature higher than that of the landing droplet, more preferably approximately 20° C. higher than that of the landing droplet, and still more preferably approximately 40° C. higher than that of the landing droplet.

As for the amount of evaporation of the droplet, it is also thought to control the amount of evaporation of the droplet by the atmospheric temperature or the vapor pressure of solvent in the atmosphere, but according to the production method of the present invention, a three-dimensional structure can be manufactured by an industrially preferable method of controlling the temperature of the surface of the substrate without using a complicated apparatus.

(Ultra-Fine Droplet Ejection Apparatus)

Figure 4:
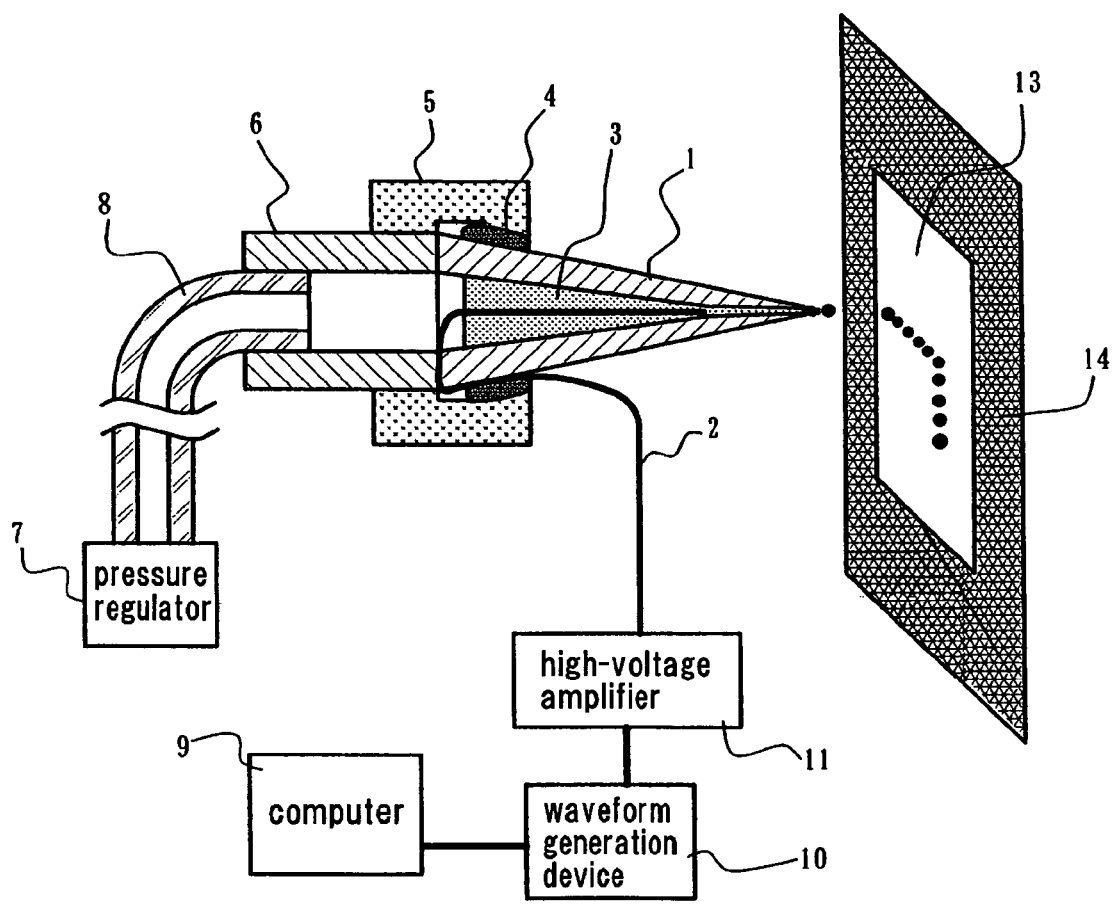
FIG. 4 is an explanatory diagram of an embodiment of an ultra-fine fluid jet apparatus which can be used in the production method of the present invention.

FIG. 4 is a diagrammatic view partly in cross section of one embodiment of an ultra-fine fluid jet apparatus preferably applicable for implementing the present invention. Reference numeral 1 in FIG. 4 denotes a nozzle having an ultra-fine diameter. In order to realize the size of an ultra-fine droplet, a flow passage having a low conductance is preferably arranged near the nozzle 1, or the nozzle 1 itself preferably has a low conductance. For this purpose, a micro capillary tube consisting of glass is preferably used. However, as the material of the nozzle, a conductive material coated with an insulator can also be used. The reasons why the nozzle 1 preferably consists of glass are that a nozzle having a diameter of about several μm can be easily formed, that, when a nozzle is clogged, a new nozzle end can be reproduced by cutting the nozzle end, that, when a glass nozzle is used, the nozzle being tapered, an electric field is easily focused on the distal end of the nozzle and an unnecessary solution moves upward by surface tension and is not retained at the nozzle end not to clog the nozzle, and that a movable nozzle can be easily formed because the nozzle has approximate flexibility. Furthermore, the low conductance is preferably $10^{-10}$ m$^3$/s or less. Although the shape having a low conductance is not limited to the following shapes, as the shape, for example, a cylindrical flow passage having a small inner diameter, or a flow passage which has an even flow passage diameter and in which a structure serving as a flow resistance is arranged, a flow passage which is curved, or a flow passage having a valve is cited.

In the method of producing a three-dimensional structure according to the present invention, an inside diameter of the tip of the nozzle is preferably 0.01 μm or more in terms of manufacture. Meanwhile, the upper limit of the inside diameter of the tip of the nozzle is preferably determined by an inside diameter of the tip of the nozzle when electrostatic force becomes larger than surface tension and an inside diameter of the tip of the nozzle when discharge conditions are satisfied by local electric field intensity. Furthermore, it is preferable that an amount of the droplet to be ejected is made smaller than that can be solidified and stacked on by evaporation, and the diameter of the nozzle is preferably adjusted according to the preferable amount of the droplet. Hence, although the inside diameter of the nozzle is affected by voltage to be applied and the kind of fluid to be used, according to general conditions, the inside diameter of the nozzle is preferably 15 μm or less, more preferably 10 μm or less. Furthermore, to more effectively use the effect of a focsed electric field, it is particularly preferable that the inside diameter of the tip of the nozzle is from 0.01 μm to 8 μm.

Then, although an outside diameter of the tip of the nozzle is determined as appropriate in accordance with the inside diameter of the tip of the nozzle, the outside diameter of the tip of the nozzle is preferably 15 μm or less, more preferably 10 μm or less, and particularly preferably 8 μm or less. It is preferable that the nozzle is formed in the shape of a needle.

The nozzle 1 is not limited to a capillary tube but may be a two-dimensional pattern nozzle formed by fine-processing. Alternatively, a construction may be employed in which a needle-shape electrode and a nozzle for supplying fluid are formed separately from each other and arranged close to each other.

For example, when the nozzle 1 consists of glass having good formability, the nozzle cannot be used as an electrode. For this reason, a metal wire 2 (metal electrode wire) such as tungsten wire may be inserted into the nozzle 1 as an electrode, or an electrode may be formed in the nozzle by plating. When the nozzle 1 itself is formed by a conductive material, an insulator may be coated on the nozzle 1. The position where the electrode is arranged is not limited, and the electrode may be arranged inside or outside the nozzle, or inside and outside the nozzle, or at a position separate from the nozzle.

A solution 3 to be ejected can be filled in the nozzle 1. In this embodiment, when an electrode is inserted in the nozzle, the electrode 2 is arranged to be dipped in the solution 3. The solution (fluid) 3 is supplied from a solution source (not shown in figures). The nozzle 1 is fixed to a holder 6 by a shield rubber 4 and a nozzle clamp 5 such that pressure is prevented from leaking.

Pressure regulated by the pressure regulator 7 is transmitted to the nozzle 1 through a pressure tube 8.

The nozzle, the electrode, the solution, the shield rubber, the nozzle clamp, the holder, and the pressure holder are shown by a sectional side view, and a substrate 13 is arranged by a substrate support 14 (substrate holder) such that the substrate 13 is close to the tip of the nozzle.

The role of the pressure regulation device according to the present invention can be used to push a fluid out of the nozzle by applying high pressure to the nozzle. However, rather, the pressure regulating device is particularly effectively used to regulate a conductance, fill a solution in the nozzle, or eliminate clogging of the nozzle. Further, the pressure regulation device is effectively used to control the position of a liquid surface or form a meniscus. As another role of the pressure regulation device, the pressure regulation device gives a differed phase from a voltage pulse and a force acting on the liquid in the nozzle is controlled, thereby controlling a micro ejection rate.

An ejection signal from the computer 9 is transmitted to an arbitrary waveform generation device 10 and controlled thereby.

An arbitrary waveform voltage generated by the arbitrary waveform generation device 10 is transmitted to the electrode 2 through a high-voltage amplifier 11. The solution 3 in the nozzle 1 is charged by the voltage. In this manner, the focused electric field intensity at the tip of the nozzle is increased.

Figure 5:
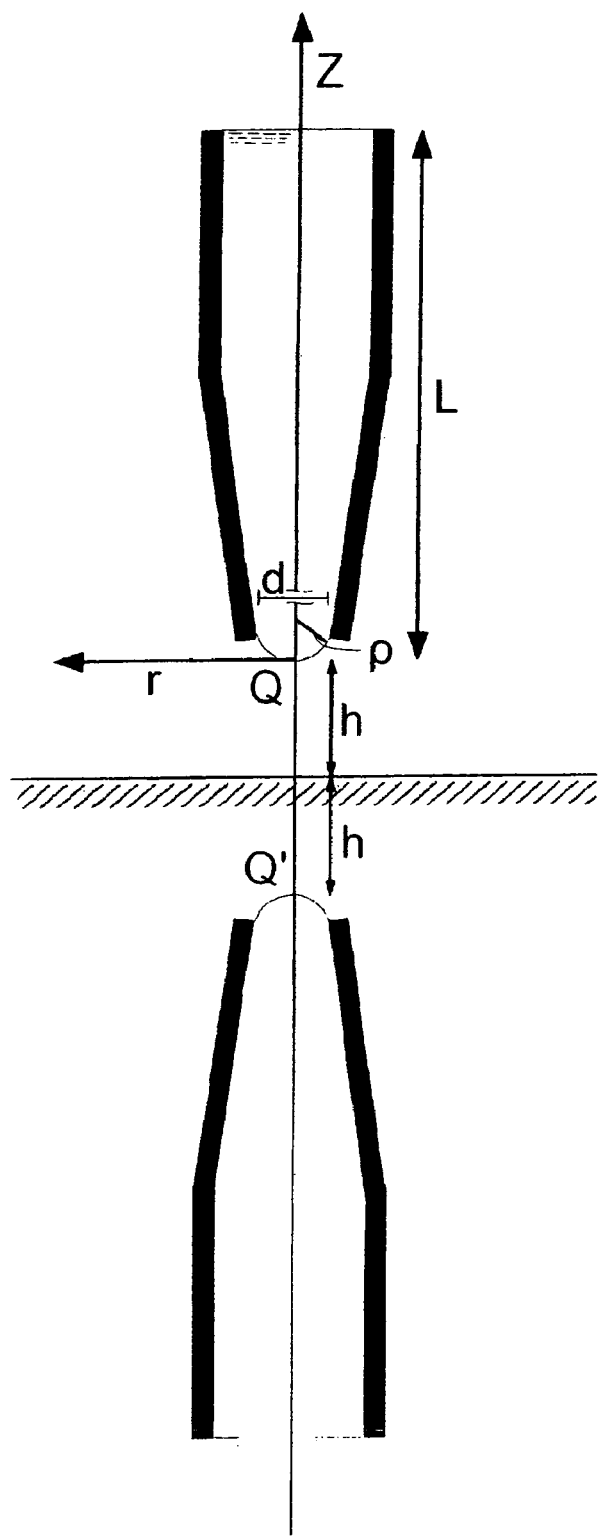
FIG. 5 is a schematic diagram explaining calculation of a electric field intensity of a nozzle according to the production method of the present invention.

In this embodiment, as shown in FIG. 5, an effect of image force induced on the counter substrate is utilized, by which a fluid droplet is charged in virtue of an electric field focusing effect at the tip of the nozzle. In this regard, FIG. 5 is a diagrammatical view schematically showing a state where a nozzle having an inside diameter d of the tip of the nozzle and filled with a conductive ink (fluid for droplet) is arranged vertically at a height of h from an endless plate-shaped conductive material. Then, r designates a direction parallel to the endless plate-shaped conductive material and Z designates a direction of Z axis (height). Furthermore, L and p designate the length of a flow passage and a radius of curvature, respectively. Q designates a charge induced at the tip of the nozzle and Q' designates an image charge induced at a symmetric position in the substrate and having an opposite charge. For this reason, it is not necessary to make a substrate 13 or a substrate supporting body 14 conductive or to apply voltage to the substrate 13 or the substrate supporting body 14 that is applied in conventional art. That is, as the substrate 13, an insulating glass substrate, a plastic substrate such as polyimide, a ceramic substrate, or a semiconductor substrate may be used. Moreover, voltage to be applied can be reduced by increasing electric field intensity focused on the tip of the nozzle. Furthermore, voltage applied to an electrode 2 may be plus or minus.

The distance between the nozzle 1 and the substrate 13 (hereinafter, unless otherwise specified, "the distance between the nozzle and the substrate" means the distance between the tip of the nozzle and the surface on the nozzle side of the substrate") can be adjusted as appropriate according to landing accuracy of the droplet given by an image force, or according to the amount of evaporation of the droplet during flight. That is, the distance between the nozzle and the substrate can be adjusted according to an increase in the viscosity of the droplet due to drying of the droplet during the flight. Then, the distance may be changed in accordance with the growth of the structure, and thereby it may be adjusted in such a way as to obtain that having higher aspect ratio. On the contrary, to avoid the influence of neighboring obtained structures close each other, the tip of the nozzle may be arranged at a position lower than the height of the structures. Meanwhile, in the case of ejecting the droplet on a concavo-convex surface of the substrate, a measure of distance is required to avoid the contact between the surface of the substrate and the tip of the nozzle. In consideration of landing accuracy of the droplet and the concavo-convex surface of the substrate, the distance between the nozzle 1 and the substrate 13 is preferably 500 μm or less. In the case where the concavo-convex of the surface of the substrate is little and a high degree of landing accuracy of the droplet is required, the distance between the nozzle 1 and the substrate 13 is preferably 100 μm or less, more preferably 50 μm or less. Meanwhile, to avoid the nozzle 1 from being too close to the substrate 13, the distance between the nozzle 1 and the substrate 13 is preferably 5 μm or more, more preferably 20 μm or more.

Although not shown in figures, feedback control is performed by detecting a nozzle position to hold the nozzle 1 at a predetermined position with respect to the substrate 13. Further, the substrate 13 may be held such that the substrate 13 is placed on a conductive or insulating substrate holder.

In this manner, the ultra-fine fluid jet apparatus according to the embodiment of the present invention has a compact size and high flexibility of equipping place, therefore the ultra-fine fluid jet apparatus can easily employ a multi-nozzle structure. An ultra-fine fluid jet apparatus described in WO 03/070381 can be preferably used for the production method of the present invention.

(Applied Voltage)

Figure 6:
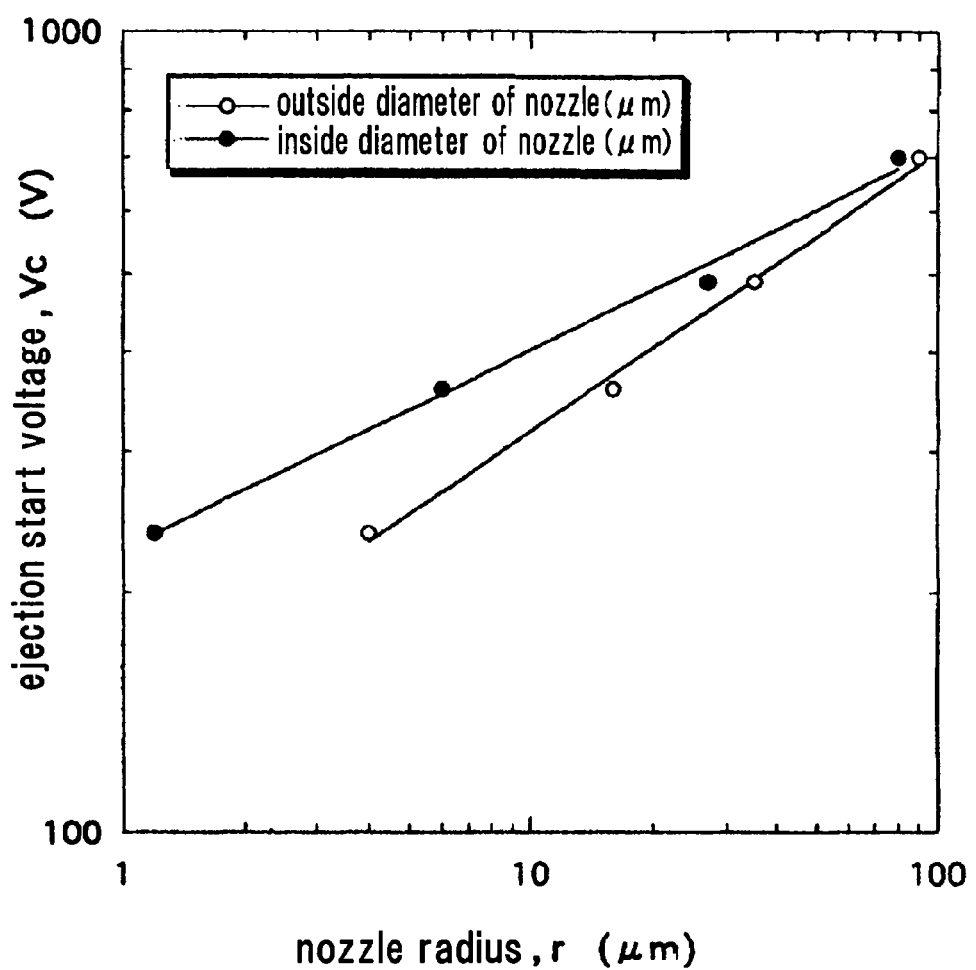
FIG. 6 is a graph showing dependency of an ejection start voltage on a nozzle diameter according to an embodiment of the production method of the present invention.

FIG. 6 shows a dependence of an ejection critical voltage Vc on a nozzle diameter d in an embodiment of the present invention. As a fluid solution, a paste of which silver particles having a diameter in the order of nanometer are dispersed is used and measurement is conducted at a condition where an nozzle-substrate distance is 100 μm. As the nozzle diameter reduction, the ejection start voltage decreases. It can be found that ejection can be performed at a voltage lower than that of a conventional method.

Figure 7:
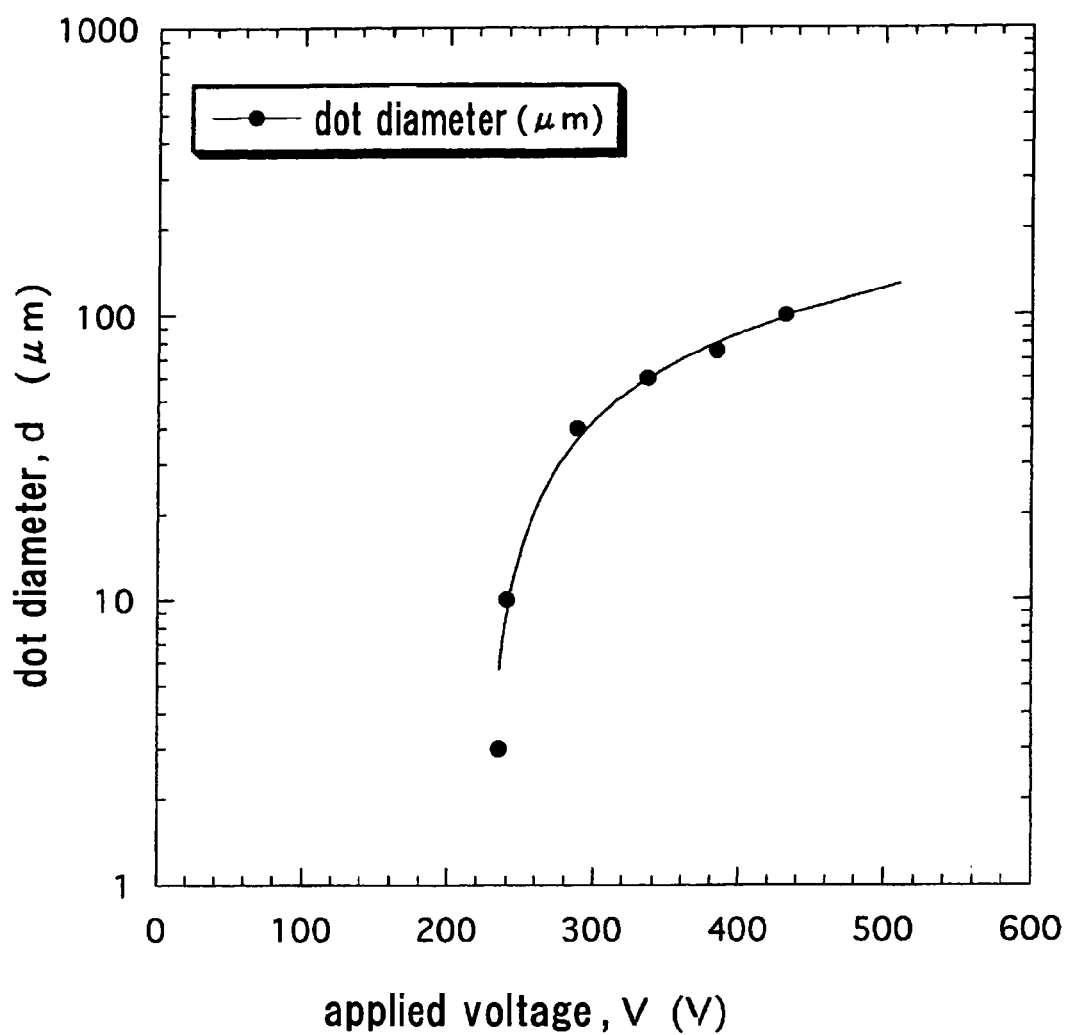
FIG. 7 is a graph showing dependency of a print dot diameter on an applied voltage according to an embodiment of the production method of the present invention.

FIG. 7 shows dependence of a print dot diameter (also referred to as "a diameter" hereinafter) on an applied voltage in an embodiment of the present invention. As a print dot diameter d, i.e., a nozzle diameter reductions, a decrease in ejection start voltage V, i.e., driving voltage can be understood. As is apparent from FIG. 7, ejection can be performed at a voltage which is considerably lower than 1000 V. When a nozzle having a diameter of about 1 μm is used, a significant effect of decrease of the driving voltage to the 200 V level can be obtained. These results resolve the conventional problem to decrease driving voltage, and contribute to a decrease in size of the apparatus and an increase in density of the nozzles of the multi-nozzle structure.

The dot diameter can be controlled by a voltage. It can also be controlled by regulation of the pulse width of an applied voltage pulse. Here, voltage in FIG. 6 and FIG. 7 is shown by the peak and the width of center value of a pulse. Then, voltage to be applied may be an alternating current or a direct current.

(Prevention, Relief of Clogging)

The tip of the nozzle 1 of the inkjet apparatus shown in FIG. 4 can be cleaned as follows: a method of putting a high pressure into the nozzle 1 and bring the substrate 13 into contact with the tip of the nozzle 1 to rub solidified solution against the substrate 13; a method to bring the solidified solution into contact with the substrate 13 to use capillary force acting on a small interval between the nozzle 1 and the substrate 13.

Further, the nozzle 1 is dipped in a solvent before the solution is filled in the nozzle 1 to fill a slight amount of solvent in the nozzle 1 by capillary force, so that the clogging of the nozzle at the start can be prevented. Moreover, when the nozzle is clogged during printing operation, the clogging can be relieved by dipping the nozzle in the solvent.

It is also effective to dip the nozzle 1 in a solvent dropped on the substrate 13, and, at the same time, to apply a pressure, a voltage, and the like.

The above measures are generally effective in the case of a solvent having a low vapor pressure and a high boiling point, e.g., tetradecane, although it is not always effective depending on the types of solutions to be used.

As will be described later, when an AC drive method is used as a voltage applying method, a stirring effect is given to the solution in the nozzle to keep homogeneity of the solution. Further, when the charging properties of the solvent and a solute are widely different from each other, clogging of the nozzle can be relieved by alternate ejection of a droplet of a solvent excessive and a droplet of a solute excessive, as compared to an average composition of the solution. When the charging characteristics, polarities, and pulse widths of the solvent and the solute were optimized in accordance with the nature of the solution, a change in composition with time can be minimized, and stable ejection characteristics could be maintained for a long period of time.

(Drawing Position Regulation)

It is practical that a substrate holder is arranged on an X-Y-Z stage to operate the position of the substrate 13. However, another configuration can be applied. In contrast to the above configuration, the nozzle 1 can also be arranged on the X-Y-Z stage.

An inter-nozzle-substrate distance is regulated to an appropriate distance by using a fine position adjusting device.

In the position regulation of the nozzle, a Z-axis stage is moved by closed loop control on the basis of distance data obtained by a laser micrometer, and the nozzle position can be kept constant at an accuracy of 1 μm or less.

(Scanning Method)

In a conventional raster scan scheme, at a step for forming a continuous line, circuit pattern may be disconnected due to a lack of landing position accuracy, defective ejection, or the like. For this reason, in this embodiment, in addition to the raster scan scheme, a vector scan scheme is employed. It is described in, e.g., S. B. Fuller et al., Journal of Microelectromechanical systems, Vol. 11, No. 1, p. 54 (2002) that circuit drawing is performed by vector scanning using a single-nozzle inkjet.

In raster scanning, new control software which was developed to interactively designate a drawing position on a computer screen was used. In the case of vector scanning, when a vector data file is loaded, complex pattern drawing can be automatically performed. As the raster scan scheme, a scheme which is performed in a conventional printer can be properly used. As the vector scan scheme, a scheme used in a conventional plotter can be properly used.

For example, as a stage to be used, SGSP-20-35 (XY) available from SIGMA KOKI CO., LTD. and Mark-204 controller are used. As control software, software is self-produced by using Labview available from National Instruments Corporation. A case in which the moving speed of the stage is regulated within the range of 1 μm/sec to 1 mm/sec to obtain the most preferable drawing will be considered below. Here, in the case of the raster scanning, the stage is moved at a pitch of 1 μm to 100 μm, and ejection can be performed by a voltage pulse, linking with the movement of the stage. In the case of the vector scanning, the stage can be continuously moved on the basis of vector data. As a substrate used here, a substrate consisting of glass, metal (copper, stainless steel, or the like), semiconductor (silicon), polyimide, polyethylene terephthalate, and the like are cited.

(Drawing by Ultra-Fine Fluid Jet Apparatus)

Because the droplet realized by the method of producing a three-dimensional structure according to the present invention is ultra-fine, depending on the kind of solvent used for ink, the droplet evaporates instantly when the droplet landing on the substrate, thereby the droplet is instantaneously fixed at a landing position. In this condition, the drying speed of the droplet is order-of-magnitude larger than the drying speed of a droplet having a particle size of several tens μm produced by a conventional technology. This is because a vapor pressure is extremely increased by rendering the droplet fine. In a conventional technology using a piezoelectric method, it is difficult to form a dot as fine as a three-dimensional structure formed by the production method of the present invention, and the landing accuracy is low.

According to the production method of the present invention, it is possible to produce a fine three-dimensional structure, of which aspect ratio can be freely set, with high accuracy and with high productivity, and possible to provide such a fine three-dimensional structure obtained by the production method.

Moreover, in the above-mentioned method of producing a three-dimensional structure according to the present invention, various kinds of materials can be used.

Furthermore, according to the method of producing a three-dimensional structure of the present invention, it is possible to extremely decrease the amount of energy consumption required to form the three-dimensional structure, and to eliminate the need for an advance preparation such as the manufacturing of a photo mask and a die, and to facilitate prototype manufacturing. In addition, the method has the advantage of being able to put a necessary amount of resources into a necessary place. Furthermore, the three-dimensional structure of the present invention can be applied to various fine structures such as electronic material.

The present invention will be described in more detail based on examples given below, but the invention is not meant to be limited by these.

EXAMPLES

Example 1

Figure 8:
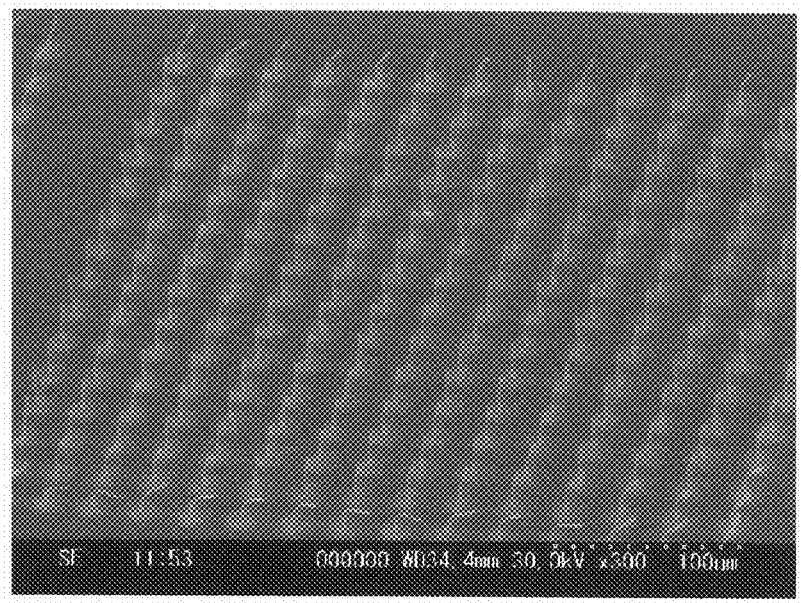
FIG. 8 is a photograph of a three-dimensional structure obtained in example 1.

A three-dimensional structure shown in FIG. 8 was produced by the use of an inkjet apparatus shown in FIG. 4.

Fine three-dimensional structures were drawn at intervals of 30 μm by the use of a commercially available metal silver particulate paste (containing approximately 50 mass % silver having a particle size of several nm (representative value: 5 nm), a residual consists a volatile solvent, a dispersing agent, a binder, and the like).

The conditions were set as follows: the inside diameter of the nozzle 1 was 600 nm; temperature was room temperature; voltage applied to the paste 3 in the nozzle 1 was 500 V in terms of the peak-to-peak voltage of alternating current; and the distance between the nozzle and the substrate was approximately 30 μm.

When ultra-fine droplets were ejected from the nozzle under the above-mentioned conditions, the ultra-fine droplets were flown and landed on the substrate into being dried and solidified, and into focused electric field, then a three-dimensional structure was formed.

In the case of the photograph shown in FIG. 8, the nozzle was once stopped at each lattice point, the nozzle was made to remain there for a time required for a structure to grow, and then the nozzle was moved from the left to the right. A three-dimensional structure had a cross-sectional diameter of 600 nm, a height of 25 μm, and an aspect ratio of 42. In the photograph, the tops of the structures are inclined to the right. This is because the structures are attracted by the electric field of the tip of the nozzle since the nozzle was moved with the electric field applied thereto.

Example 2

A three-dimensional structure was formed under the same condition as in the example 1 except that an ethyl alcohol solution of polyvinylphenol was used, that the inside diameter of the tip of the nozzle was 5 μm, that the peak-to-peak voltage of alternating current was 450 V, and that the distance between the nozzle and the substrate was approximately 70 μm.

The three-dimensional structure formed under this condition had a cross-sectional diameter of 5 μm, a height of 10 μm, and an aspect ratio of 2. It was found that even when polyvinylphenol was used, the evaporating and drying of flying droplets and the focused electric field could grow a structure and could form a three-dimensional structure.

Example 3

A three-dimensional structure was formed under the same condition as in the example 1 except that a solution prepared by dissolving a precursor of morphologic phase boundary composition (MPB) of lead zirconate titanate (PZT Pb(Ti:Zr)O3) in a solvent of 2-methoxyethanol and ethylene glycol, that the inside diameter of the tip of the nozzle was 5 μm, that the voltage of direct current was 1338 V, and that the distance between the nozzle and the substrate was 50 μm. The three-dimensional structure formed under this condition had a cross-sectional diameter of 4 μm, a height of 8 μm, and an aspect ratio of 2. It was found that even when lead zirconate titanate was used, the evaporating and drying flying droplets and the focused electric field could grow a structure and could form a three-dimensional structure.

Example 4

A three-dimensional structure was formed under the same condition as in the example 1 except that a solution prepared by dissolving fluorescent particles G25 (made by Duke, styrene dinylbenzene copolymer particles having a particle diameter of 0.028 μm) in a mixed solvent of water and ethylene glycol, that the inside diameter of the tip of the nozzle was 15 μm, that the peak-to-peak voltage of alternating current was from 900 V to 1000 V, and that the distance between the nozzle and the substrate was 50 μm. The three-dimensional structure formed under this condition had a cross-sectional diameter of 4 μm, a height of 24 μm, and an aspect ratio of 6. It was found that even when fluorescent particles were used, the evaporating and drying flying droplets and the focused electric field could grow a structure and could form a three-dimensional structure.

Example 5

A three-dimensional structure was formed by the use of the same metal silver particulate paste (nano-paste made by Harima Chemicals, Inc.) as in the example 1, under the same condition as in the example 1, except that the inside diameter of the tip of the nozzle was 1 μm, that the peak-to-peak voltage of alternating current was 380 V, and that the distance between the nozzle and the substrate was 100 μm. The three-dimensional structure formed under this condition had a cross-sectional diameter of 300 nm, a height of approximately 75 μm, and an aspect ratio of 250.

Example 6

A three-dimensional structure was formed by the use of the same metal silver particulate paste (nano-paste made by Harima Chemicals, Inc.) as in the example 1, under the same condition as in the example 1, except that the inside diameter of the tip of the nozzle was 1 μm, that the peak-to-peak voltage of alternating current was 550 V, and that the distance between the nozzle and the substrate was 200 μm.

Figure 9:
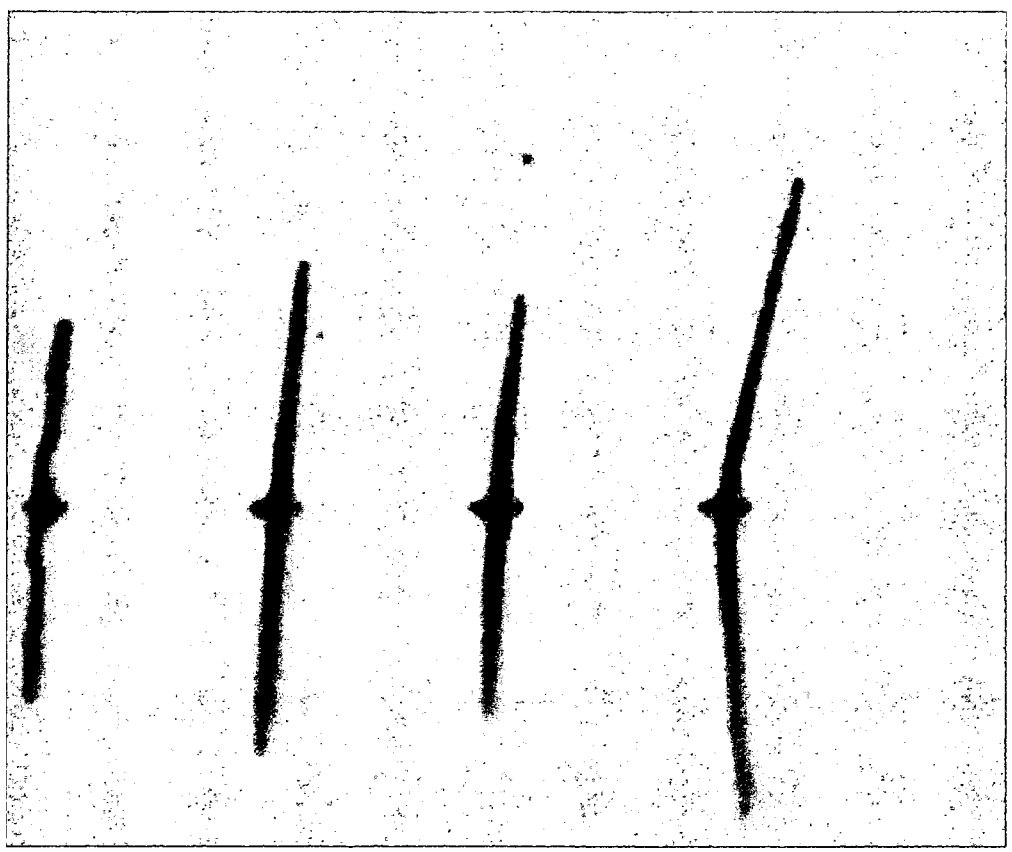
FIG. 9 is a photograph of a three-dimensional structure obtained in example 6.

The three-dimensional structure formed under this condition had a cross-sectional diameter of 3 μm, a height of 180 μm, and an aspect ratio of 60 (FIG. 9). In this example, the growth of the three-dimensional structure was stopped when its height reached 180 μm. However, a three-dimensional structure having a largerer height can be formed.

Example 7

A three-dimensional structure was formed by the use of the same metal silver particulate paste as in the example 1, under the same condition as in the example 1, except that the inside diameter of the tip of the nozzle was 3 μm, that the peak-to-peak voltage of alternating current was 571 V, and that the distance between the nozzle and the substrate was 130 μm.

The three-dimensional structure formed under this condition had a cross-sectional diameter of 1 μm, a height of 100 μm, and an aspect ratio of 100.

Comparative Example 1

A three-dimensional structure was formed by the use of the same metal silver particulate paste as in the example 1, under the same condition as in the example 1, except that the inside diameter of the tip of the nozzle was 20 µm, that the peak-to-peak voltage of alternating current was 1500 V, and that the distance between the nozzle and the substrate was 80 µm.

Figure 10:
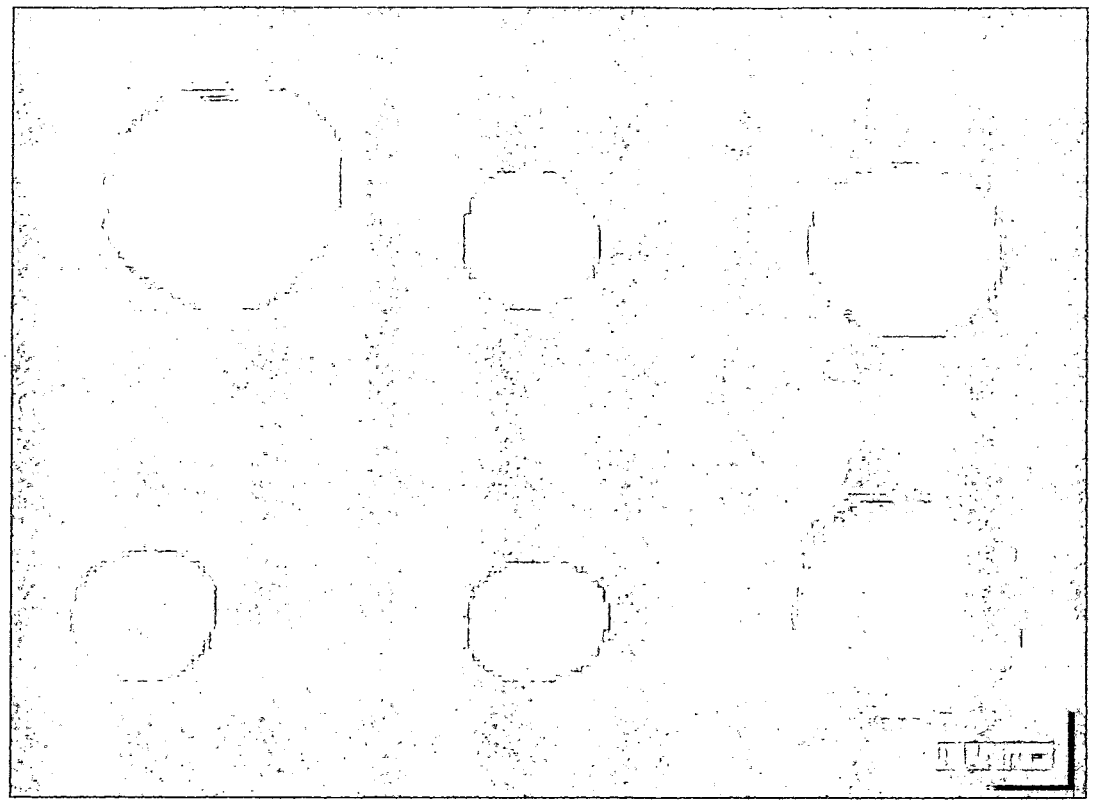
FIG. 10 is a photograph of a liquid drop that is wetly spread by the production method of a comparative example 1.

As a result, there was brought about a state where the ejected droplets were wetly spread on the substrate and hence a three-dimensional structure was not formed (FIG. 10).

Example 8

A three-dimensional structure was formed by the use of the same metal silver particulate paste as in the example 1, under the same condition as in the example 1, except that the inside diameter of the tip of the nozzle was 1 µm, that the peak-to-peak voltage of alternating current was 425 V, that the distance between the nozzle and the substrate was approximately 50 µm, that rest time of the nozzle at one place was 5 sec, and that the temperature of the substrate was changed from 23.5° C. to 39.3° C. by the use of a Peltier element.

Figure 11:
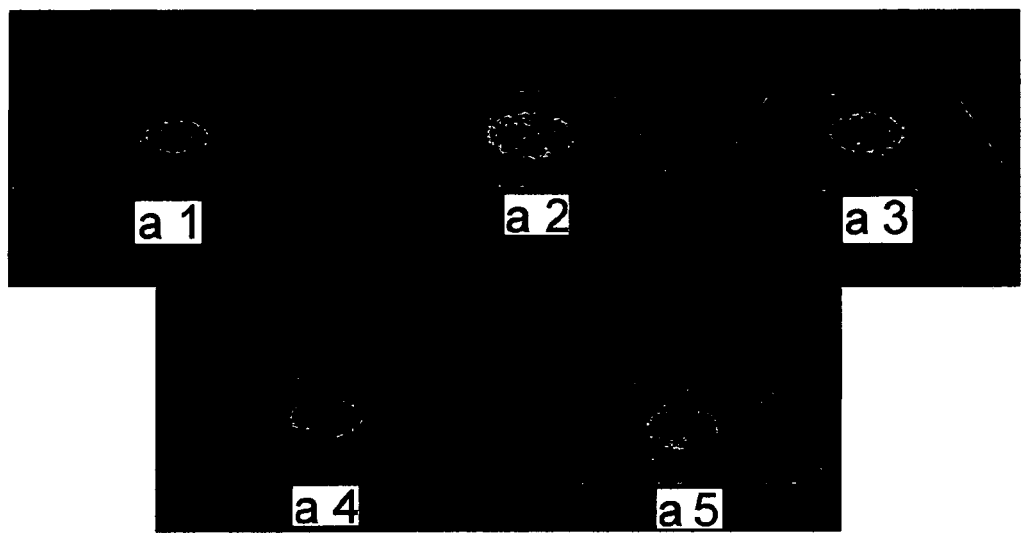
FIG. 11 is photographs showing results obtained when three-dimensional structures are formed at the respective surface temperatures of substrates in example 8.

As a result, a three-dimensional structure was not formed when the temperature of the substrate was 23.5° C. (a1 in FIG. 11), 25.3° C. (a2 in FIG. 11), and 35.2° C. (a3 in FIG. 11). When the temperature of the substrate was 36.7° C. (a4 in FIG. 11) and 39.3° C. (a5 in FIG. 11), a three-dimensional structure was observed to grow. As a result, at the temperature of 39.3° C., a structure having a cross-sectional diameter of approximately 4 µm, a height of approximately 9 µm, and an aspect ratio of approximately 2.3 could be obtained.

Example 9

A three-dimensional structure was formed by the use of the same metal silver particulate paste as in the example 1, under the same condition as in the example 1, except that the inside diameter of the tip of the nozzle was 1 µm, and that the peak-to-peak voltage of alternating current was 525 V and that the distance between the nozzle and the substrate was approximately 50 µm and that the temperature of the substrate was changed from 30° C. to 60° C. by the use of the Peltier element.

Figure 12:
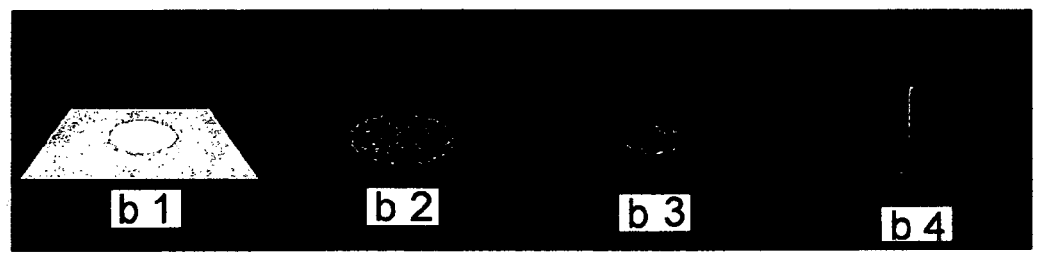
FIG. 12 is photographs showing results obtained when three-dimensional structures are formed at the respective surface temperatures of substrates in example 9.

As a result, a three-dimensional structure could not be formed when the temperature of the substrate was 30° C. (b1 in FIG. 12), 40° C. (b2 in FIG. 12) and 50° C. (b3 in FIG. 12). When the temperature of the substrate was 60° C. (b4 in FIG. 12), a three-dimensional structure was formed, and a structure having a cross-sectional diameter of approximately 4 µm, a height of approximately 50 µm, and an aspect ratio of approximately 12.5 could be obtained.

Example 10

A three-dimensional structure was formed by the use of a metal gold particulate paste (gold nano-paste NPG-J made by Harima Chemicals, Inc.) under the same condition as in the example 1 except that the inside diameter of the tip of the nozzle was 1 µm and that the peak-to-peak voltage of alternating current was from 400 V to 420 V, and that the distance between the nozzle and the substrate was approximately 50 µm and that the temperature of the substrate was changed from 40° C. to 80° C. by the use of the Peltier element.

Figure 13:
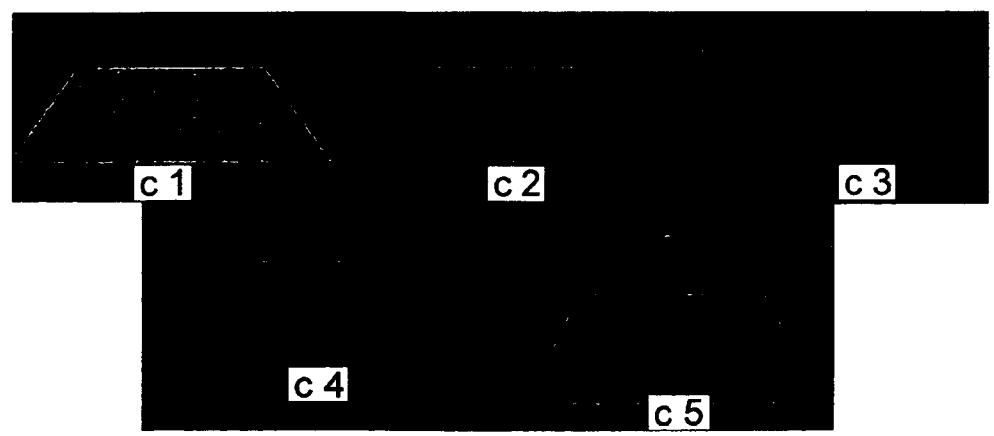
FIG. 13 is photographs showing results obtained when three-dimensional structures are formed at the respective surface temperatures of substrates in example 10.

As a result, a three-dimensional structure could not be formed when the temperature of the substrate was 40° C. (c1 in FIG. 13), 50° C. (c2 in FIG. 13), 60° C. (c3 in FIG. 13), and 70° C. (c4 in FIG. 13). When the temperature of the substrate was 80° C. (c5 in FIG. 13), a three-dimensional structure was formed, and a structure having a cross-sectional diameter of approximately 7 µm, a height of approximately 43 µm, and an aspect ratio of approximately 6 could be obtained.

INDUSTRIAL APPLICABILITY

A method for producing a three-dimensional structure according to the present invention and a fine three-dimensional structure producted by the method are useful as a technology for producing a hollow wiring, a beam, a pillar-shaped structure, a sensor, an electrode, an optical element, and the like of a fine-machining level.

A specific example of the use of electrode includes manufacturing a laminated integrated circuit unit by an inkjet device, which is described in U.S. Pat. No. 6,114,187. When a three-dimensional structure of the present invention is used in place of an electrode of several tens µm described in the above-mentioned patent document, a laminated integrated circuit can be further miniaturized in an extremely fine size.

Furthermore, by making a die by resin or the like, a plate having a hole made by using the transfer of a three-dimensional structure can be formed. This is also useful for such a field requiring an ultra-fine machining technology that includes a laminated integrated circuit substrate, just as with the above-mentioned example.

Having described our invention as related to the present embodiments, it is our intention that the invention not be limited by any of the details of the description, unless otherwise specified, but rather be construed broadly within its spirit and scope as set out in the accompanying claims.

The invention claimed is:

1. A method of producing a three-dimensional structure, comprising the steps of:
providing a needle-shaped nozzle body having a fine inside diameter at a tip thereof, the nozzle supplied with a fluid;
arranging a tip of the nozzle to be close to a substrate;
ejecting a fluid droplet having an ultra-fine diameter from the tip of the nozzle toward a surface of the substrate by applying a voltage having a prescribed waveform to the needle-shaped nozzle body via the electrode so as to make the droplet fly and land on the substrate, and thereby the droplet being dried to be a solidified substance after landing on the substrate; and
maintaining a position and continually ejecting subsequent droplets by applying the prescribed waveform voltage to the nozzle for the droplets being stacked on said solidified substance so as to form a grown three-dimensional structure,
wherein the nozzle inside diameter is 0.01 µm to 8 µm,
wherein an electric line of force is attracted to the top of the solidified substance of the droplet, and wherein the three-dimensional structure is grown by stacking the subsequent flying droplet guided along the electric line of force onto the top of the solidified substance,
wherein a diameter of the ejected droplet is 15 µm or less, and
wherein the fluid droplet dries and solidifies by evaporation and drying to increase the viscosity of the fluid to allow stacking.

2. The method of producing a three-dimensional structure according to claim 1, wherein a cross-sectional diameter of the three-dimensional structure is controlled by a volatile property of the droplet ejected from the needle-shaped fluid-ejection body.

3. The method of producing a three-dimensional structure according to claim 1, wherein a temperature of the substrate is controlled in that the previously landed droplet on the substrate is volatilized to be hard enough for the subsequent droplet stacked thereon.

4. The method of producing a three-dimensional structure according to claim 1, wherein a surface temperature of the substrate is controlled by at least one heating means selected from the group consisting of a Peltier element, an electric heater, an infrared heater, a heater using fluid such as an oil heater, a silicon rubber heater, and a thermistor, that is fixed to the substrate or a substrate supporting body.

5. The method of producing a three-dimensional structure according to claim 1, wherein a surface temperature of the substrate is controlled in a range of from room temperature to 100° C.

6. The method of producing a three-dimensional structure according to claim 1, wherein the fluid is a solution containing metal particulates.

7. The method of producing a three-dimensional structure according to claim 1, wherein the fluid is a polymer solution.

8. The method of producing a three-dimensional structure according to claim 1, wherein the fluid is a solution containing ultra-fine ceramic particles.

9. The method of producing a three-dimensional structure according to claim 1, wherein the fluid is a sol-gel solution of ceramics.

10. The method of producing a three-dimensional structure according to claim 1, wherein the fluid is a low molecular weight compound solution.

11. The method of producing a three-dimensional structure according to claim 1, wherein the fluid is a fluid containing at least one solution selected from the group consisting of a solution containing metal particulates, a polymer solution, a solution containing ultra-fine ceramic particles, a sol-gel solution of ceramics, and a low-molecular weight compound solution.

12. The method of producing a three-dimensional structure according to claim 1, wherein a diameter of the droplet is 5 μm or less.

13. The method of producing a three-dimensional structure according to claim 1, wherein a diameter of the droplet is 3 μm or less.

14. The method of producing a three-dimensional structure according to claim 1, wherein a time required for the droplet to be dried and solidified is 2 seconds or less.

15. The method of producing a three-dimensional structure according to claim 14, wherein the time required for the droplet to be dried and solidified is 1 second or less.

16. The method of producing a three-dimensional structure according to claim 14, wherein the time required for the droplet to be dried and solidified is 0.1 second or less.

17. The method of producing a three-dimensional structure according to claim 1, wherein a flying speed of the droplet is 4 m/sec or more.

18. The method of producing a three-dimensional structure according to claim 17, wherein the flying speed is 6 m/sec or more.

19. The method of producing a three-dimensional structure according to claim 17, wherein the flying speed is 10 m/sec or more.

20. The method of producing a three-dimensional structure according to claim 1, wherein the steps are conducted in an atmosphere having a vapor pressure of the fluid lower than a saturated vapor pressure of the fluid.

21. The method of producing a three-dimensional structure according to claim 1, wherein a dielectric constant of the fluid to be ejected is 1 or more.

22. The method of producing a three-dimensional structure according to claim 1, wherein the needle-shaped nozzle is a micro-capillary tube.

23. The method of producing a three-dimensional structure according to claim 1, further comprising an electrode within the nozzle.

24. The method of producing a three-dimensional structure according to claim 1, wherein the three-dimensional structure has an aspect ratio of 3 or more.

25. The method of producing a three-dimensional structure according to claim 1, wherein the evaporation includes volatilization.

* * * * *